(12) United States Patent
Chen

(10) Patent No.: US 8,395,455 B1
(45) Date of Patent: Mar. 12, 2013

(54) RING OSCILLATOR

(75) Inventor: Chien-Liang Chen, Taoyuan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/274,181

(22) Filed: Oct. 14, 2011

(51) Int. Cl.
*H03K 3/03* (2006.01)

(52) U.S. Cl. .......................................... 331/57
(58) Field of Classification Search ...................... 331/57
See application file for complete search history.

(56) References Cited

U.S. PATENT DOCUMENTS

| | | | |
|---|---|---|---|
| 3,663,828 A | 5/1972 | Low et al. | |
| 3,818,402 A | 6/1974 | Golaski et al. | |
| 4,163,944 A | 8/1979 | Chambers et al. | |
| 4,245,355 A | 1/1981 | Pascoe et al. | |
| 4,409,608 A | 10/1983 | Yoder | |
| 4,816,784 A | 3/1989 | Rabjohn | |
| 5,159,205 A | 10/1992 | Gorecki et al. | |
| 5,208,725 A | 5/1993 | Akcasu | |
| 5,212,653 A | 5/1993 | Tanaka | |
| 5,406,447 A | 4/1995 | Miyazaki | |
| 5,446,309 A | 8/1995 | Adachi et al. | |
| 5,459,437 A * | 10/1995 | Campbell | 331/111 |
| 5,583,359 A | 12/1996 | Ng et al. | |
| 5,619,170 A * | 4/1997 | Nakamura | 331/1 A |
| 5,637,900 A | 6/1997 | Ker et al. | |
| 5,760,456 A | 6/1998 | Grzegorek et al. | |
| 5,808,330 A | 9/1998 | Rostoker et al. | |
| 5,923,225 A | 7/1999 | De Los Santos | |
| 5,952,891 A * | 9/1999 | Boudry | 331/57 |
| 5,959,820 A | 9/1999 | Ker et al. | |
| 6,008,102 A | 12/1999 | Alford et al. | |
| 6,081,146 A | 6/2000 | Shiochi et al. | |
| 6,172,378 B1 | 1/2001 | Hull et al. | |
| 6,194,739 B1 | 2/2001 | Ivanov et al. | |
| 6,246,271 B1 | 6/2001 | Takada et al. | |
| 6,285,578 B1 | 9/2001 | Huang | |
| 6,291,872 B1 | 9/2001 | Wang et al. | |
| 6,370,372 B1 | 4/2002 | Molnar et al. | |
| 6,407,412 B1 | 6/2002 | Iniewski et al. | |
| 6,427,226 B1 | 7/2002 | Mallick et al. | |
| 6,448,858 B1 | 9/2002 | Helms et al. | |
| 6,452,442 B1 | 9/2002 | Laude | |
| 6,456,221 B2 | 9/2002 | Low et al. | |
| 6,461,914 B1 | 10/2002 | Roberts et al. | |
| 6,480,137 B2 | 11/2002 | Kulkarni et al. | |
| 6,483,188 B1 | 11/2002 | Yue et al. | |
| 6,486,765 B1 | 11/2002 | Katayanagi | |
| 6,509,805 B2 | 1/2003 | Ochiai | |
| 6,518,165 B1 | 2/2003 | Han et al. | |
| 6,521,939 B1 | 2/2003 | Yeo et al. | |
| 6,545,547 B2 | 4/2003 | Fridi et al. | |

(Continued)

*Primary Examiner* — Ryan Johnson
*Assistant Examiner* — Christian L Rivera
(74) *Attorney, Agent, or Firm* — J.C. Patents

(57) ABSTRACT

A ring oscillator includes a plurality of inverting delay units serially connected in a form of a ring. Each of the inverting delay units receives an input signal and generates an output signal, and each of the inverting delay units includes a buffer and a delay circuit. The buffer has an input terminal and an output terminal. The input terminal receives the input signal, and the output terminal generates a buffered input signal. The delay circuit serves to provide a first time delay and a second time delay. Besides, according to a voltage level of the buffered input signal, the delay circuit provides a first reference voltage to generate the output signal after the first time delay or provides a second reference voltage to generate the output signal after the second time delay.

9 Claims, 2 Drawing Sheets

U.S. PATENT DOCUMENTS

| | | | |
|---|---|---|---|
| 6,560,306 | B1 | 5/2003 | Duffy et al. |
| 6,588,002 | B1 | 7/2003 | Lampaert et al. |
| 6,593,838 | B2 | 7/2003 | Yue |
| 6,603,360 | B2 | 8/2003 | Kim et al. |
| 6,608,363 | B1 | 8/2003 | Fazelpour |
| 6,611,223 | B2 | 8/2003 | Low et al. |
| 6,625,077 | B2 | 9/2003 | Chen |
| 6,630,897 | B2 | 10/2003 | Low et al. |
| 6,639,298 | B2 | 10/2003 | Chaudhry et al. |
| 6,653,868 | B2 | 11/2003 | Oodaira et al. |
| 6,668,358 | B2 | 12/2003 | Friend et al. |
| 6,700,771 | B2 | 3/2004 | Bhattacharyya |
| 6,720,608 | B2 | 4/2004 | Lee |
| 6,724,677 | B1 | 4/2004 | Su et al. |
| 6,756,656 | B2 | 6/2004 | Lowther |
| 6,795,001 | B2 | 9/2004 | Roza |
| 6,796,017 | B2 | 9/2004 | Harding |
| 6,798,011 | B2 | 9/2004 | Adan |
| 6,810,242 | B2 | 10/2004 | Molnar et al. |
| 6,822,282 | B2 | 11/2004 | Randazzo et al. |
| 6,822,312 | B2 | 11/2004 | Sowlati et al. |
| 6,833,756 | B2 | 12/2004 | Ranganathan |
| 6,841,847 | B2 | 1/2005 | Sia et al. |
| 6,847,572 | B2 | 1/2005 | Lee et al. |
| 6,853,272 | B1 | 2/2005 | Hughes |
| 6,876,056 | B2 | 4/2005 | Tilmans et al. |
| 6,885,534 | B2 | 4/2005 | Ker et al. |
| 6,901,126 | B1 | 5/2005 | Gu |
| 6,905,889 | B2 | 6/2005 | Lowther |
| 6,909,149 | B2 | 6/2005 | Russ et al. |
| 6,927,664 | B2 | 8/2005 | Nakatani et al. |
| 6,958,522 | B2 | 10/2005 | Clevenger et al. |
| 7,009,252 | B2 | 3/2006 | Lin et al. |
| 7,027,276 | B2 | 4/2006 | Chen |
| 7,205,612 | B2 | 4/2007 | Cai et al. |
| 7,262,069 | B2 | 8/2007 | Chung et al. |
| 7,365,627 | B2 | 4/2008 | Yen et al. |
| 7,368,761 | B1 | 5/2008 | Lai et al. |
| 7,405,642 | B1 | 7/2008 | Hsu et al. |
| 7,425,874 | B2 | 9/2008 | Risbo et al. |
| 7,672,100 | B2 | 3/2010 | Van Camp |
| 7,863,991 | B1 * | 1/2011 | Iravani ............ 331/57 |
| 7,969,219 | B2 | 6/2011 | Venkataraman et al. |
| 2002/0019123 | A1 | 2/2002 | Ma et al. |
| 2002/0036545 | A1 | 3/2002 | Fridi et al. |
| 2002/0188920 | A1 | 12/2002 | Lampaert et al. |
| 2003/0076636 | A1 | 4/2003 | Ker et al. |
| 2003/0127691 | A1 | 7/2003 | Yue et al. |
| 2003/0183403 | A1 | 10/2003 | Kluge et al. |
| 2005/0068112 | A1 | 3/2005 | Glenn |
| 2005/0068113 | A1 | 3/2005 | Glenn |
| 2005/0087787 | A1 | 4/2005 | Ando |
| 2006/0006431 | A1 | 1/2006 | Jean et al. |
| 2006/0108694 | A1 | 5/2006 | Hung et al. |
| 2006/0267102 | A1 | 11/2006 | Cheng et al. |
| 2007/0102745 | A1 | 5/2007 | Hsu et al. |
| 2007/0210416 | A1 | 9/2007 | Hsu et al. |
| 2007/0234554 | A1 | 10/2007 | Hung et al. |
| 2007/0246801 | A1 | 10/2007 | Hung et al. |
| 2007/0249294 | A1 | 10/2007 | Wu et al. |
| 2007/0296055 | A1 | 12/2007 | Yen et al. |
| 2008/0094166 | A1 | 4/2008 | Hsu et al. |
| 2008/0185679 | A1 | 8/2008 | Hsu et al. |
| 2008/0189662 | A1 | 8/2008 | Nandy et al. |
| 2008/0200132 | A1 | 8/2008 | Hsu et al. |
| 2008/0299738 | A1 | 12/2008 | Hsu et al. |
| 2008/0303623 | A1 | 12/2008 | Hsu et al. |
| 2009/0029324 | A1 | 1/2009 | Clark |
| 2009/0201625 | A1 | 8/2009 | Liao et al. |
| 2010/0279484 | A1 | 11/2010 | Wang et al. |

* cited by examiner

RING OSCILLATOR

BACKGROUND OF THE INVENTION

1. Field of the Invention

The invention relates to a ring oscillator. More particularly, the invention relates to an inverting delay unit of a ring oscillator.

2. Description of Related Art

A ring oscillator is commonly applied to generate periodic clock signals due to its simple circuit structure. According to the related art, the ring oscillator can be composed of a plurality of inverters serially connected in a form of a ring. Conventionally, the number of stages of inverters is often increased or decreased, or dimensions of transistors in the inverters are adjusted, so as to control the frequency of the clock signals which are generated by the ring oscillator. Namely, in order to generate the clock signals with the reduced frequency, the number of stages of inverters in the conventional ring oscillator need be effectively increased, and/or the transistors in the inverters need be enlarged.

Note that signals transmitted between the inverters in the ring oscillator are continuously transited. During signal transition, the transistors of the inverters serially connected between power sources are simultaneously turned on, which results in current leakage. The increase in the number of stages of the inverters and/or the increase in the dimensions of transistors in the inverters will further result in significant current leakage. Moreover, the clock signals generated by the conventional ring oscillator may jitter to a great extent, thus posing a negative impact on the signal quality.

SUMMARY OF THE INVENTION

The invention is directed to a ring oscillator that can effectively reduce power consumption.

In an embodiment of the invention, a ring oscillator having a plurality of inverting delay units is provided. The inverting delay units are serially connected in a form of a ring. Each of the inverting delay units receives an input signal and generates an output signal, and each of the inverting delay units includes a buffer and a delay circuit. The buffer has an input terminal and an output terminal. The input terminal receives the input signal, and the output terminal generates a buffered input signal. The delay circuit is coupled to the output terminal of the buffer for providing a first time delay and a second time delay. Besides, according to a voltage level of the buffered input signal, the delay circuit provides a first reference voltage to generate the output signal after the first time delay or provides a second reference voltage to generate the output signal after the second time delay.

Based on the above, the inverting delay units described in the embodiments of the invention can determine whether to provide the first voltage after the first time delay or the second voltage after the second time delay for generating the output signal based on the voltage level of the buffered input signal. Thereby, the inverting delay units in the ring oscillator can generate the output signal merely by voltage selection. Here, the output signal and the input signal are inverted. As such, the power conventionally consumed by the inverters in the signal transition process can be reduced.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EXEMPLARY EMBODIMENTS

Figure 1:
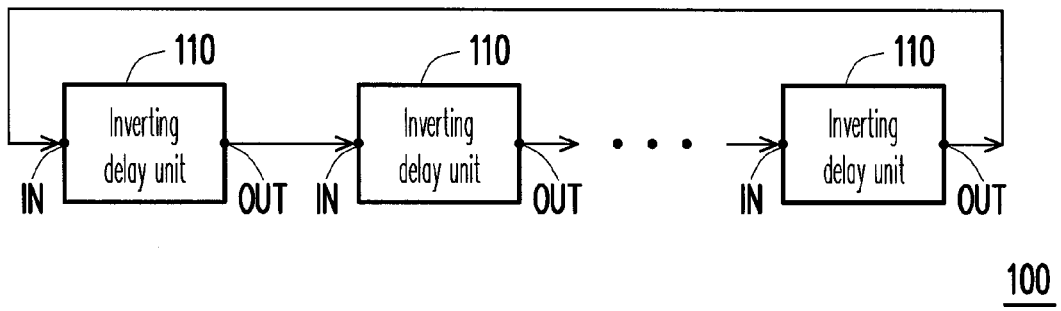
FIG. 1 is a schematic view illustrating a ring oscillator 100 according to an embodiment of the invention.

Please refer to FIG. 1. Specifically, FIG. 1 is a schematic view illustrating a ring oscillator 100 according to an embodiment of the invention. The ring oscillator 100 includes a plurality of inverting delay units 110, and the inverting delay units 110 are serially connected. Each of the inverting delay units 110 has an input terminal IN and an output terminal OUT. The inverting delay units 110 are serially connected in the form of a ring. To be more specific, the $i^{th}$ stage of inverting delay unit 110 has the output terminal coupled to the input terminal of the $(i+1)^{th}$ stage of inverting delay unit 110, and i is a positive integer. The output terminal of the last stage of inverting delay unit 110 is coupled to the input terminal of the first stage of inverting delay unit 110. The number of the inverting delay units 110 in the ring oscillator 100 can be one or more, and the required number of the inverting delay units 110 can be determined based on the required frequency of clock signals to be generated by the ring oscillator 100.

It should be mentioned that a time delay exists between the output signal generated at the output terminal of an inverting delay unit 110 and the input signal received by the input terminal of the inverting delay unit 110. Besides, the output signal and the input signal are inverted. In brief, the inverting delay unit 110 inverts the input signal received at its input terminal and generates the output signal after a time delay. Additionally, the clock signals generated by the ring oscillator 100 can be obtained at the input terminal or the output terminal of any of the inverting delay units 110.

In order to better understand the ring oscillator 100 in this embodiment, the internal structure of the inverting delay unit 110 is described below.

Figure 2:
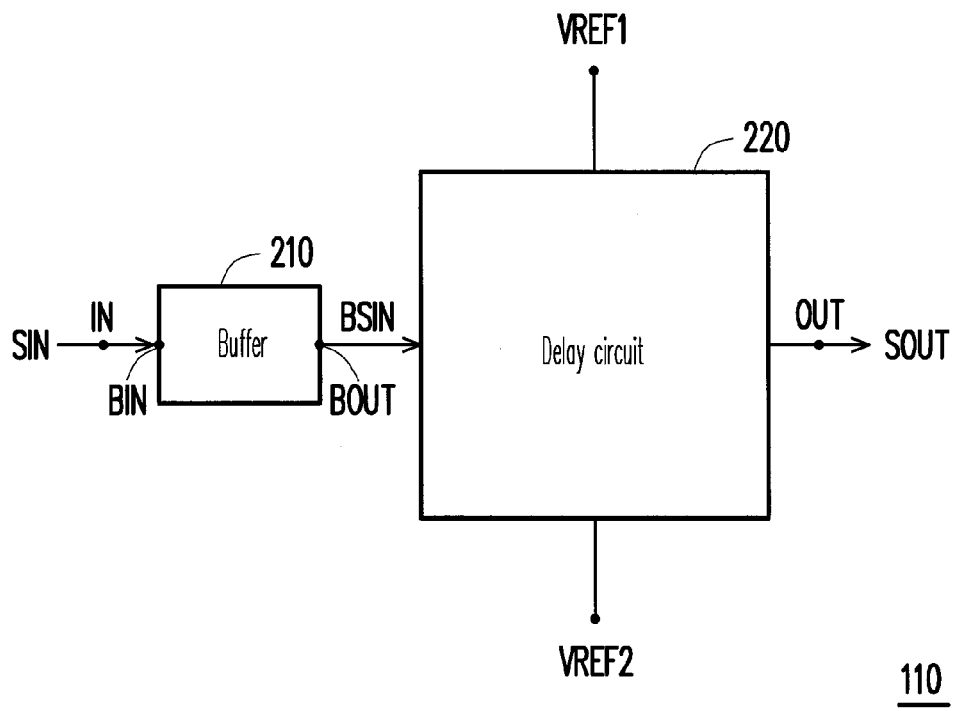
FIG. 2 illustrates implementation of an inverting delay unit 110 according to an embodiment of the invention.

Please refer to FIG. 2. Specifically, FIG. 2 illustrates implementation of an inverting delay unit 110 according to an embodiment of the invention. According to this embodiment, the inverting delay unit 110 includes a buffer 210 and a delay circuit 220. The buffer 210 has an input terminal BIN and an output terminal BOUT. The input terminal BIN of the buffer 210 is connected to the input terminal IN of the inverting delay unit 110, and the output terminal BOUT of the buffer 210 is connected to the delay circuit 220. The input terminal BIN of the buffer 210 receives the input signal SIN through the input terminal IN and generates the buffered input signal BSIN at the output terminal BOUT of the buffer 210. Here, the input signal SIN and the buffered input signal BSIN can be the same or can be inverted.

The delay circuit 220 is coupled to the output terminal of the buffer 210 and receives the buffered input signal BSIN through the output terminal of the buffer 210. The delay circuit 220 serves to provide a first time delay and a second time delay. In addition, the delay circuit 220 receives reference voltages VREF1 and VREF2. According to the voltage level of the buffered input signal BSIN, the delay circuit 220 selects to provide the reference voltage VREF1 to the output terminal OUT for generating the output signal SOUT after a first time delay or provide the reference voltage VREF2 to the output terminal OUT for generating the output signal SOUT after a second time delay. Here, the voltage level of the reference voltage VREF1 is different from that of the reference voltage VREF2. To sum up, the reference voltage VREF1 can be a power source voltage (e.g., at 3 volts), and the reference voltage VREF2 can be a ground voltage (e.g., at 0 volt).

Practically, when the voltage levels of the buffered input signal BSIN and the input signal SIN are inverted, and the voltage level of the buffered input signal BSIN is a logic high voltage level, the delay circuit 220 provides the reference voltage VREF1 (equivalently at the logic high voltage level) to the output terminal OUT for generating the output signal SOUT after the first time delay. After the buffered input signal BSIN is transited to be at the logic low voltage level, the delay circuit 220 provides the reference voltage VREF2 (equivalently at the logic low voltage level) to the output terminal OUT for generating the output signal SOUT after the second time delay.

When the voltage levels of the buffered input signal BSIN and the input signal SIN are not inverted, and the voltage level of the buffered input signal BSIN is a logic high voltage level, the delay circuit 220 provides the reference voltage VREF2 (at the logic low voltage level) to the output terminal OUT for generating the output signal SOUT after the second time delay. Besides, after the buffered input signal BSIN is transited to be at the logic high voltage level, the delay circuit 220 provides the reference voltage VREF1 (equivalently at the logic high voltage level) to the output terminal OUT for generating the output signal SOUT after the first time delay.

Figure 3:
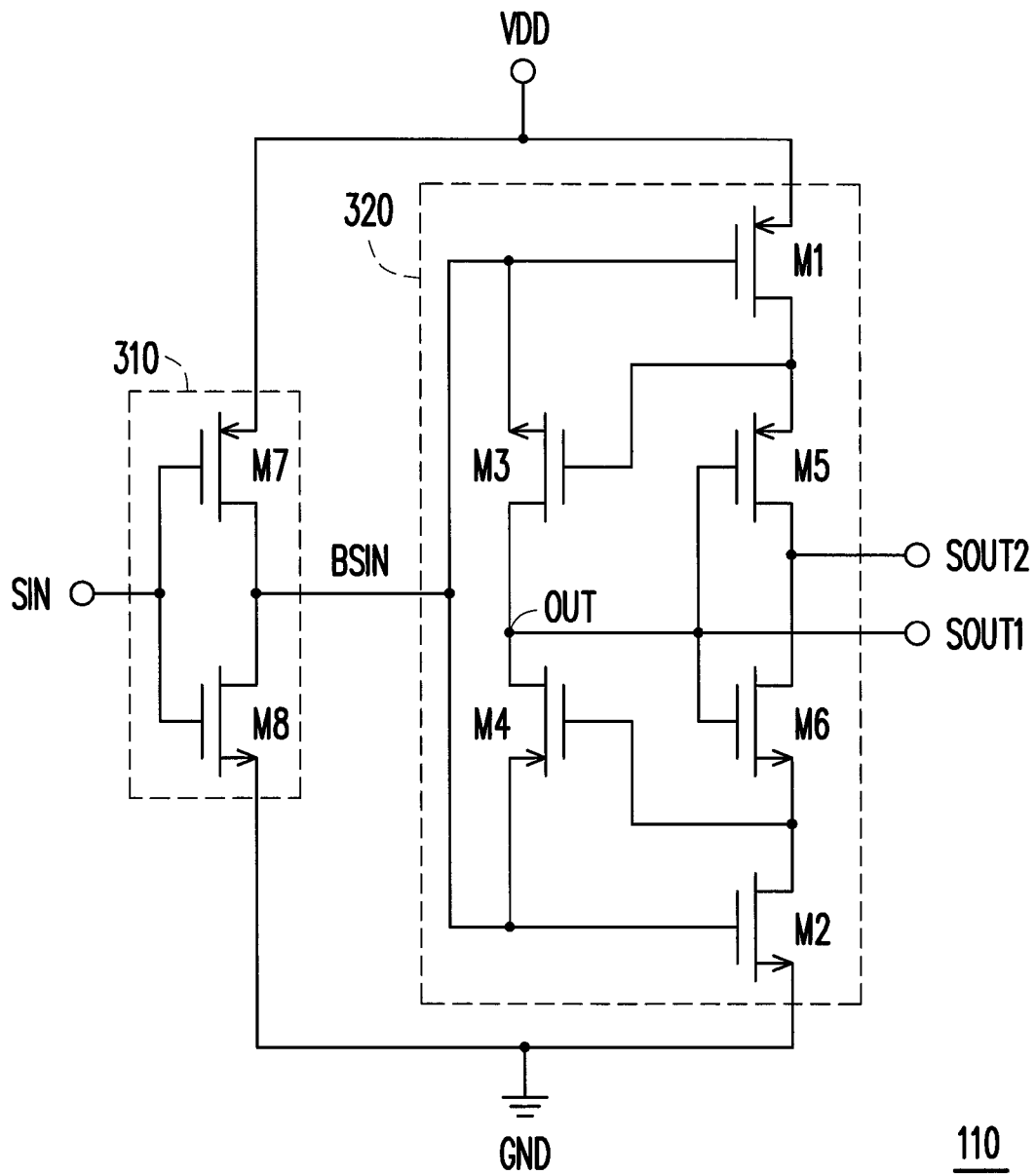
FIG. 3 illustrates another implementation of the inverting delay unit 110 according to an embodiment of the invention.

Please refer to FIG. 3. Specifically, FIG. 3 illustrates another implementation of an inverting delay unit 110 according to an embodiment of the invention. According to this embodiment, the inverting delay unit 110 includes a buffer 310 and a delay circuit 320. The buffer 310 is an inverter. Besides, the buffer 310 is constituted by transistors M7 and M8. The source of the transistor M7 is coupled to a power source voltage VDD; the gate of the transistor M7 is coupled to the gate of the transistor M8 to collectively receive the input signal SIN, the drain of the transistor M7 is coupled to the source of the transistor M8; the drain of the transistor M8 is coupled to the ground voltage GND.

The delay circuit 320 includes transistors M1~M6. Here, the first terminal (the source) of the transistor M1 is coupled to a reference voltage equal to the power source voltage VDD, and the control terminal (the gate) of the transistor M1 receives the buffered input signal BSIN generated by the buffer 310. The control terminal (the gate) of the transistor M3 is coupled to the second terminal (the drain) of the transistor M1. The first terminal (the source) of the transistor M3 receives the buffered input signal BSIN. The second terminal (the drain) of the transistor M3 generates the output signal SOUT1. Here, the transistor M1 is a p-type transistor, and the transistor M3 is an n-type transistor.

Besides, the first terminal (the source) of the transistor M2 is coupled to a reference voltage equal to the ground voltage GND, and the control terminal (the gate) of the transistor M2 receives the buffered input signal BSIN generated by the buffer 310. The control terminal (the gate) of the transistor M4 is coupled to the second terminal (the drain) of the transistor M2. The first terminal (the source) of the transistor M4 receives the buffered input signal BSIN. The second terminal (the drain) of the transistor M4 generates the output signal SOUT1. Here, the transistor M4 is a p-type transistor, and the transistor M2 is an n-type transistor.

As to the overall operation of the delay circuit 320, when the input signal SIN is at the logic high voltage level, the buffered input signal BSIN is at the logic level voltage level. At the same time, the transistor M1 is turned on based on the buffered input signal BSIN and transmits the power source voltage VDD (equal to the logic high level voltage) to the gate of the transistor M3. Since the transistor M3 is an n-type transistor, the transistor M3 is turned on based on the power source voltage VDD received by the gate of the transistor M3 and transmits the buffered input signal BSIN received by the first terminal of the transistor M3 to the output terminal OUT, so as to generate the output signal SOUT1 equal to the logic low level voltage.

On the contrary, when the input signal SIN is the logic low level voltage, the buffered input signal BSIN is the logic high level voltage. At the same time, the transistor M2 is turned on based on the buffered input signal BSIN and transmits the ground voltage GND (equal to the logic low level voltage) to the gate of the transistor M4. Since the transistor M4 is a p-type transistor, the transistor M4 is turned on based on the ground voltage GND received by the gate of the transistor M4 and transmits the buffered input signal BSIN received by the first terminal of the transistor M4 to the output terminal OUT, so as to generate the output signal SOUT1 equal to the logic high level voltage.

Note that when the input signal SIN is transited from the logic high level voltage to the logic low level voltage, the transistors M1 and M3 are immediately disconnected right at the time when the input signal SIN is being transited, and the connection between the delay circuit 320 and the ground voltage GND is cut off. By contrast, when the input signal SIN is transited from the logic low level voltage to the logic high level voltage, the transistors M2 and M4 are immediately disconnected right at the time when the input signal SIN is being transited, and the connection between the delay circuit 320 and the power source voltage VDD is cut off. In other words, short circuit between the power source voltage VDD and the ground voltage GND is unlikely to occur in the delay circuit 320. Therefore, unnecessary power consumption can be prevented, and the output signal does not jitter.

According to this embodiment, when the input signal SIN is transited from the logic low level voltage to the logic high level voltage, the output signal SOUT1 is correspondingly transited to the logic low level voltage after a time delay posterior to the transition of the input signal SIN. The time delay is equal to the sum of a time frame during which the transistor M1 is turned on based on the buffered input signal BSIN, a time frame during which the transistor M3 receives the power source voltage VDD transmitted from the transistor M1 and is turned on, and a time frame during which the buffered input signal BSIN passes through the transistor M3 and becomes the output signal SOUT1.

When the input signal SIN is transited from the logic high level voltage to the logic low level voltage, the output signal SOUT1 is correspondingly transited to the logic high level voltage after a time delay posterior to the transition of the input signal SIN. The time delay is equal to the sum of a time frame during which the transistor M2 is turned on based on the buffered input signal BSIN, a time frame during which the transistor M4 receives the ground voltage GND transmitted from the transistor M2 and is turned on, and a time frame during which the buffered input signal BSIN passes through the transistor M4 and becomes the output signal SOUT1.

In order to extensively apply the delay circuit 320, the delay circuit 320 further includes transistors M5 and M6. The first terminal (the source) of the transistor M5 is coupled to the second terminal of the transistor M1. The control terminal (the gate) of the transistor M5 receives the output signal SOUT1. The second terminal (the drain) of the transistor M5 generates the inverted output signal SOUT2. The first terminal (the source) of the transistor M6 is coupled to the second terminal of the transistor M2. The control terminal (the gate) of the transistor M6 receives the output signal SOUT1. The second terminal (the drain) of the transistor M6 is coupled to the second terminal (the drain) of the transistor M5.

In brief, the transistors M5 and M6 serve to generate the inverted output signal SOUT2 (i.e., the output signal SOUT1 and the output signal SOUT2 are inverted). Besides, given that the output signal SOUT1 is generated after a time delay based on the input signal, the transistors M1, M5, M6, and M2 are not transiently turned on at the same time, which leads to effective reduction of power consumption.

In addition, according to this embodiment, the input signal SIN and the output signal SOUT1 provided by the inverting delay unit 110 are inverted. However, if the buffer 310 is replaced by a buffer circuit that does not generate the inverted signal (e.g., replaced by even inverters that are serially connected), the inverting delay unit 110 can alternately provide the output signal SOUT2 as its output signal. Thereby, the input signal SIN and the signal output by the inverting delay unit 110 can be continuously inverted.

In light of the foregoing, the reference voltage can be determined based on the input voltage according to the embodiments of the invention. Besides, after a time delay, the inverting delay units can determine whether to provide the first voltage or the second voltage for generating the output voltage. The ring oscillator can then be constituted by the inverting delay units serially connected in a form of a ring. Such a ring oscillator can effectively reduce the current leakage caused by signal transition and remove possible jitters of the output signal. As a result, the efficacy of the ring oscillator can be effectively improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A ring oscillator having N inverting delay units serially connected in a form of a ring, each of the inverting delay units receiving an input signal and generating an output signal, N being a positive integer, each of the inverting delay units comprising:
   a buffer having an input terminal and an output terminal, the input terminal receiving the input signal, the output terminal generating a buffered input signal; and
   a delay circuit coupled to the output terminal of the buffer for providing a first time delay and a second time delay, the delay circuit providing a first reference voltage to generate the output signal after the first time delay or providing a second reference voltage to generate the output signal after the second time delay according to a voltage level of the buffered input signal, wherein the delay circuit comprises:
   a first transistor having a first terminal, a second terminal, and a control terminal, the first terminal of the first transistor receiving the first reference voltage, the control terminal of the first transistor receiving the buffered input signal;
   a second transistor having a first terminal, a second terminal, and a control terminal, the first terminal of the second transistor receiving the second reference voltage, the control terminal of the second transistor receiving the buffered input signal;
   a third transistor having a first terminal, a second terminal, and a control terminal, the first terminal of the third transistor receiving the buffered input signal, the control terminal of the third transistor being coupled to the second terminal of the first transistor, the second terminal of the third transistor generating the output signal; and
   a fourth transistor having a first terminal, a second terminal, and a control terminal, the first terminal of the fourth transistor receiving the buffered input signal, the control terminal of the fourth transistor being coupled to the second terminal of the second transistor, the second terminal of the fourth transistor being coupled to the second terminal of the third transistor.

2. The ring oscillator as recited in claim 1, wherein the delay circuit further comprises:
   a fifth transistor having a first terminal, a second terminal, and a control terminal, the first terminal of the fifth transistor being coupled to the second terminal of the first transistor, the control terminal of the fifth transistor receiving the output signal, the second terminal of the fifth transistor generating an inverting output signal; and
   a sixth transistor having a first terminal, a second terminal, and a control terminal, the first terminal of the sixth transistor being coupled to the second terminal of the second transistor, the control terminal of the sixth transistor receiving the output signal, the second terminal of the sixth transistor being coupled to the second terminal of the fifth transistor.

3. The ring oscillator as recited in claim 2, wherein the fifth transistor is a p-type transistor, the sixth transistor is an n-type transistor, the first reference voltage is a power source voltage, and the second reference voltage is a ground voltage.

4. The ring oscillator as recited in claim 2, wherein the fifth transistor is an n-type transistor, the sixth transistor is a p-type transistor, the first reference voltage is a ground voltage, and the second reference voltage is a power source voltage.

5. The ring oscillator as recited in claim 1, wherein the first and fourth transistors are p-type transistors, the second and third transistors are n-type transistors, the first reference voltage is a power source voltage, and the second reference voltage is a ground voltage.

6. The ring oscillator as recited in claim 1, wherein the first and fourth transistors are n-type transistors, the second and third transistors are p-type transistors, the second reference voltage is a power source voltage, and the first reference voltage is a ground voltage.

7. The ring oscillator as recited in claim 1, wherein the buffer is an inverter, and the buffered input signal is an inverted signal of the input signal.

8. The ring oscillator as recited in claim 1, wherein the first time delay is equal to a sum of a time frame during which the first transistor is turned on based on the buffered input signal, a time frame during which the third transistor receives the first reference voltage transmitted from the first transistor and is turned on, and a time frame during which the buffered input signal passes through the third transistor and becomes the output signal.

9. The ring oscillator as recited in claim 1, wherein the second time delay is equal to a sum of a time frame during which the second transistor is turned on based on the buffered input signal, a time frame during which the fourth transistor receives the second reference voltage transmitted from the second transistor and is turned on, and a time frame during which the buffered input signal passes through the fourth transistor and becomes the output signal.

* * * * *